United States Patent
Choi et al.

(10) Patent No.: US 11,543,984 B2
(45) Date of Patent: Jan. 3, 2023

(54) MEMORY CONTROLLER, STORAGE DEVICE AND OPERATING METHOD THEREOF

(71) Applicant: SK hynix Inc., Gyeonggi-do (KR)

(72) Inventors: Hoon Choi, Gyeonggi-do (KR); Beom Ju Shin, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 55 days.

(21) Appl. No.: 17/204,117

(22) Filed: Mar. 17, 2021

(65) Prior Publication Data
US 2022/0083223 A1    Mar. 17, 2022

(30) Foreign Application Priority Data
Sep. 16, 2020  (KR) .......................... 10-2020-0118696

(51) Int. Cl.
*G06F 3/06* (2006.01)

(52) U.S. Cl.
CPC ............ *G06F 3/064* (2013.01); *G06F 3/0604* (2013.01); *G06F 3/0652* (2013.01); *G06F 3/0655* (2013.01); *G06F 3/0679* (2013.01)

(58) Field of Classification Search
CPC ...... G06F 12/06; G06F 3/0604; G06F 3/0614; G06F 3/064; G06F 3/0652; G06F 3/0655; G06F 3/0679

USPC .................................................. 711/154, 103
See application file for complete search history.

(56) References Cited

U.S. PATENT DOCUMENTS

| | | | | |
|---|---|---|---|---|
| 2012/0124304 A1* | 5/2012 | Asnaashari | ......... | G06F 12/0246 711/159 |
| 2015/0095663 A1* | 4/2015 | Seng | ....................... | G06F 21/79 713/193 |
| 2022/0147250 A1* | 5/2022 | Lee | .......................... | G06F 3/064 |

FOREIGN PATENT DOCUMENTS

KR    10-2014-0142035    12/2014
KR    10-1552207          9/2015

* cited by examiner

*Primary Examiner* — Hashem Farrokh
(74) *Attorney, Agent, or Firm* — IP & T Group LLP

(57) ABSTRACT

A storage device includes a memory device and a memory controller. The memory device includes a first plane and a second plane, each including data blocks configured to store user data, one or more replacement blocks configured to replace one or more bad blocks, and system blocks configured to store system information. The memory controller is configured to replace, when a bad block is detected in the first plane after all the one or more replacement blocks in the first plane are used to replace previously detected bad blocks, the detected bad block with a target system block selected among the system blocks in the first plane.

20 Claims, 11 Drawing Sheets

MEMORY CONTROLLER, STORAGE DEVICE AND OPERATING METHOD THEREOF

CROSS-REFERENCE TO RELATED APPLICATION

The present application claims priority under 35 U.S.C. § 119(a) to Korean patent application number 10-2020-0118696, filed on Sep. 16, 2020, in the Korean Intellectual Property Office, the entire disclosure of which is incorporated by reference herein.

BACKGROUND

1. Technical Field

One or more embodiments described herein relate to an electronic device, and more particularly to a storage device and an operating method thereof.

2. Related Art

A storage device stores data under the control of a host device, such as a computer or a smart phone. Structurally, the storage device is equipped with a memory device, and in some cases may also include a memory controller for controlling the memory device. In other cases, the memory controller may be externally coupled to the memory device.

Generally speaking, memory devices are classified as volatile memory devices and nonvolatile memory devices. Volatile memory devices store data only when power is supplied. The stored data is lost when the supply of power is interrupted. Examples of volatile memory devices include Static Random Access Memory (SRAM) and Dynamic Random Access Memory (DRAM).

Nonvolatile memory devices retain storage of data even when the supply of power is interrupted. Examples of nonvolatile memory devices include Read Only Memory (ROM), Programmable ROM (PROM), Electrically Programmable ROM (EPROM), Electrically Erasable ROM (EEROM), and flash memory.

SUMMARY

Embodiments provide a memory device having improved bad block management performance and an operating method of the memory device.

In accordance with an aspect of the present disclosure, there is provided a storage device including: a memory device including a first plane and a second plane, each including data blocks configured to store user data, one or more replacement blocks configured to replace one or more bad blocks, and system blocks configured to store system information; and a memory controller configured to replace, when a bad block is detected in the first plane after all the one or more replacement blocks in the first plane are used to replace previously detected bad blocks, the detected bad block with a target system block selected among the system blocks in the first plane.

In accordance with another aspect of the present disclosure, there is provided a method for operating a storage device including a first plane and a second plane, each including data blocks configured to store user data, one or more replacement blocks configured to replace one or more bad blocks, and system blocks configured to store system information, the method comprising: detecting whether a bad block occurs in the first plane; and replacing, when a bad block is detected in the first plane after all the one or more replacement blocks in the first plane are used to replace previously detected bad blocks, the detected bad block with a target system block selected among the system blocks in the first plane.

In accordance with still another aspect of the present disclosure, there is provided a memory controller for controlling a memory device including a first plane and a second plane, each including data blocks configured to store user data, one or more replacement blocks configured to replace one or more bad block, and system blocks configured to store system information, the memory controller comprising: a block manager configured to allocate, to a super block, at least one of the data blocks included in the first plane and at least one of the data blocks included in the second plane; and an operation controller configured to control the memory device to perform a multi-plane operation of simultaneously driving the first plane and the second plane, when performing a memory operation on the super block, wherein, when a bad block is detected in the first plane after all the one or more replacement blocks in the first plane are used to replace previously detected bad blocks, the block manager is configured to replace the detected bad block with a target system block selected among the system blocks in the first plane.

In accordance with another aspect of the present disclosure, there is provided a method for operating a storage device including a first plane and a second plane, each including data blocks configured to store user data, one or more replacement blocks configured to replace one or more bad blocks, and system blocks configured to store system information, the method comprising: detecting a bad block in the first plane; moving, when no more replacement blocks are available to replace the bad block in the first plane, data stored in a target system block selected among the system blocks in the first plane to one of the replacement blocks in the second plane; and replacing the bad block with the target system block that is included in the first plane.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements or one or more intervening elements may also be present. Like reference numerals refer to like elements throughout.

DETAILED DESCRIPTION

The specific structural or functional description disclosed herein is merely illustrative for the purpose of describing embodiments according to the present disclosure. The embodiments according to the present disclosure can be implemented in various forms, and cannot be construed as limited to the embodiments set forth herein.

Figure 1:
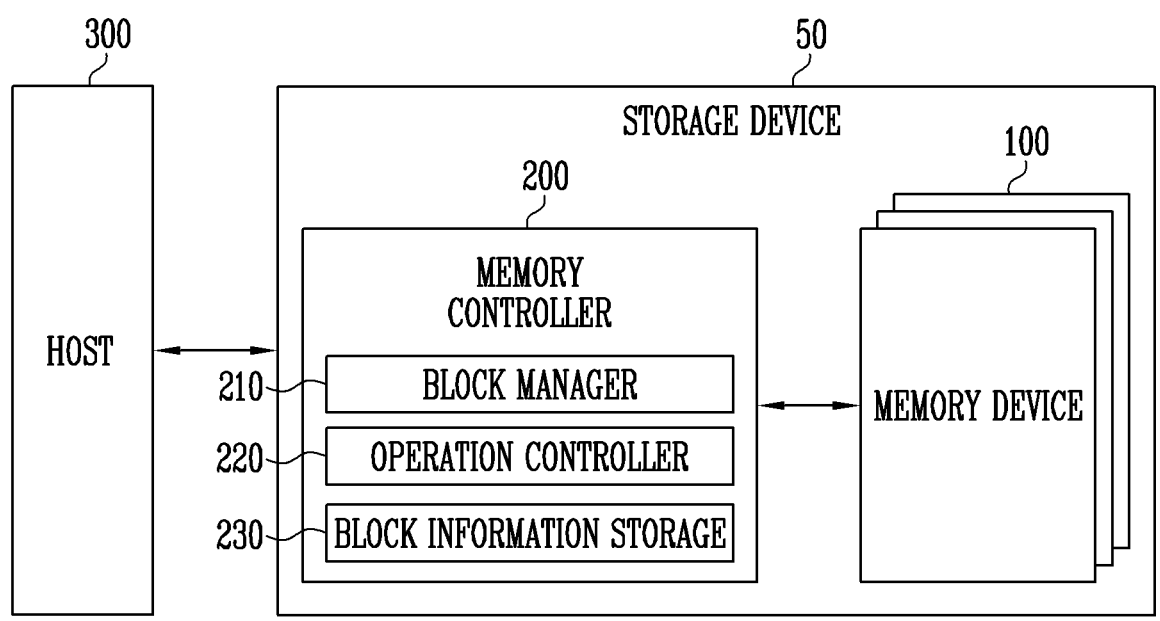
FIG. 1 illustrates an embodiment of a storage device.

FIG. 1 is a diagram illustrating an embodiment of a storage device 50 which may include a memory device 100 and a memory controller 200 configured to control operation of a memory device 100. The storage device 50 may be, for example, a device for storing data under control of a host 300. Examples of the host 300 include a mobile phone, a smart phone, an MP3 player, a laptop computer, a desktop computer, a game console, a TV, a tablet PC or an in-vehicle infotainment.

The storage device 50 may be manufactured as any one of various types of storage devices according, for example, to the communication protocol or standard of a host interface of the host 300. Examples of the storage device 50 include a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), and a memory stick.

The storage device 50 may be manufactured to have various kinds of package types. Examples include Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data under control of the memory controller 200. The memory device 100 may include one or more memory cell arrays, each of which includes a plurality of memory cells for storing data. Each of the memory cells may be configured, for example, as a Single Level Cell (SLC) storing one data bit, a Multi-Level Cell (MLC) storing two data bits, a Triple Level Cell (TLC) storing three data bits, or a Quad Level Cell (QLC) storing four data bits.

Each memory cell array may include a plurality of memory blocks, with each memory block including one or a plurality of memory cells. One memory block may include a plurality of pages. In an embodiment, a page may be considered a unit for storing data in the memory device 100 or for reading data stored in the memory device 100.

The memory block may be a unit for erasing data. Examples of the memory device 100 include a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), and a Spin Transfer Torque Random Access Memory (STT-RAM). A case where the memory device 100 is a NAND flash memory will be described for illustrative purposes.

The memory device 100 receives a command and an address from the memory controller 200 and accesses an area selected by the address in a corresponding memory cell array. For example, the memory device 100 may perform an operation instructed by the command on an area selected by the address. In one embodiment, the memory device 100 may perform a write (program) operation, a read operation, and/or an erase operation. In a program operation, the memory device 100 may program data in the area selected by the address. In a read operation, the memory device 100 may read data from the area selected by the address. In an erase operation, the memory device 100 may erase data stored in the area selected by the address.

In an embodiment, the memory device 100 may include a plurality of planes. Each plane may include a plurality of memory blocks. Each plane may independently perform a read operation, a program operation, and an erase operation. In an embodiment, the plane may include a data block for storing user data, a system block for storing system information for performing an operation of the storage device 50, and a replacement block for replacing a bad block.

The memory controller 200 may control overall operations of the storage device 50. When power is applied to the storage device 50, the memory controller 200 may execute firmware (FW). When the memory device 100 is a flash memory device, the memory controller 200 may execute FW such as a Flash Translation Layer (FTL) for controlling communication between the host 300 and the memory device 100.

In an embodiment, the memory controller 200 may receive data and a Logical Block Address (LBA) from the host 300 and may translate the LBA into a Physical Block Address (PBA) representing addresses of memory cells in the memory device 100, in which data is to be stored.

The memory controller 200 may control the memory device 100 to perform a program operation, a read operation, an erase operation and/or another operation, in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a command, an address, and data independent from receiving a request from the host 300, and may transmit the command, the address, and the data to the memory device 100. For example, the memory controller 200 may provide the command, the address, and the data to the memory device 100 to perform background operations, e.g., a program operation for wear leveling and a program operation for garbage collection.

In an embodiment, the memory controller 200 may control at least two memory devices 100, for example, according to a predetermined (e.g., interleaving) technique so as to improve operational performance. In one embodiment, the interleaving technique may be an operating technique that allows operating sections of at least two memory devices 100 to overlap with each other.

In an embodiment, the memory controller 200 may include a block manager, an operation controller 220, and a block information storage 230.

When a bad block is detected among data blocks in one plane, the block manager 210 may replace the detected bad block with a system block of the same plane. For example, the memory device 100 may include first and second planes. The number of the planes that may be included in the memory device 100 is not limited to this embodiment.

When a bad block is detected among data blocks in a first plane, the block manager 210 may replace the detected bad block with a replacement block of the first plane. When a bad block is detected among the data blocks in the first plane after all replacement blocks of the first plane are used to replace the bad block, the block manager 210 may replace the detected bad block with a system block of the first plane. After the block manager 210 moves data stored in the system block of the first plane to a replacement block of a second plane, the block manager 210 may replace the detected bad block in the first plane with the system block.

In an embodiment, the block manager 210 may select a system block as a memory block for replacing a bad block, when the system block stores an amount of system information smaller than or equal to the storage capacity of one memory block. When amount of system information is greater than the storage capacity of one memory block, the system information may be divided and stored in two or more system blocks. In an embodiment, the system information may include firmware information for driving the storage device 50, map data information, rebuild information for error recovery, and/or other information.

The block manager 210 may allocate, to one super block, a data block included in the first plane and a data block included in the second plane. When a bad block is detected in a data block allocated to a super block, the block manager 210 may exclude the corresponding bad block from being allocated to the super block. When the detected bad block is replaced with another block, the block manager 210 may allocate the replaced block to the corresponding super block.

In an embodiment, when a bad block is detected in the data block in the first plane, among the data blocks allocated to the super block, the block manager 210 may replace the detected bad block with the system block of the same first plane. When the detected bad block is replaced with the system block, the block manager 210 may update super block allocation information.

The operation controller 220 may control the memory device 100 to perform a memory operation on the super block. The memory operation may be a read operation, a program operation, or an erase operation.

In an embodiment, in the memory operation on the super block, the operation controller 220 may control the memory device 100 to perform a multi-plane operation of simultaneously driving the first and second planes. In an embodiment, the operation controller 220 may control the memory device 100 to independently perform a memory operation performed on each of the data blocks allocated to the super block for each plane. The multi-plane operation may be an operation of performing, in parallel, memory operations on data blocks of each plane allocated to the super block.

The block information storage 230 may store block management information on kinds and addresses of memory blocks included in a plane. The block information storage 230 may store super block allocation information on a memory block allocated to a super block.

The host 300 may communicate with the storage device 50 using one or more forms of communication. Examples include a Universal Serial Bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
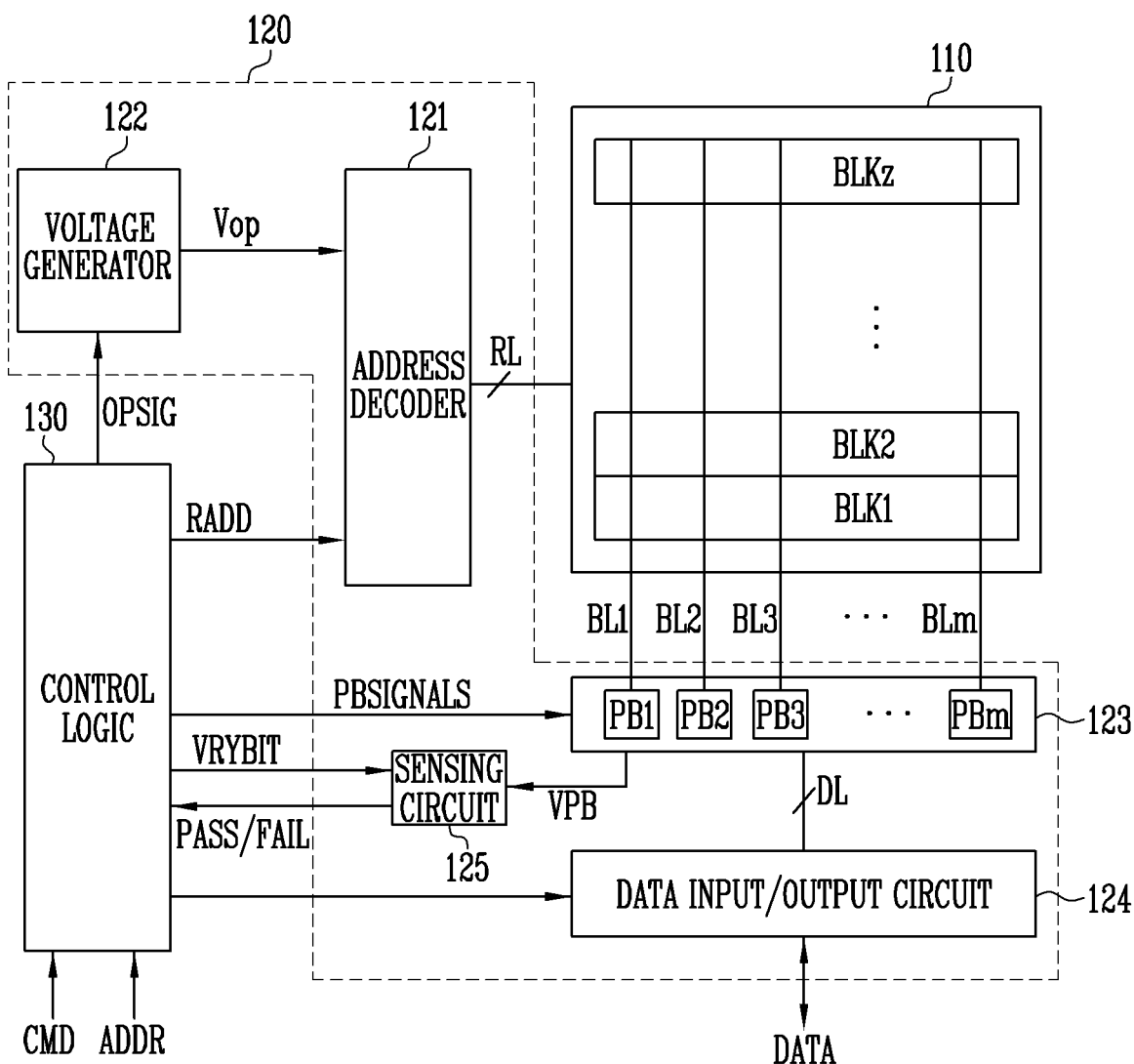
FIG. 2 illustrates an embodiment of a memory device.

FIG. 2 is a diagram illustrating an embodiment of the memory device 100 shown in FIG. 1. Referring to FIG. 2, the memory device 100 may include a memory cell array 100, a peripheral circuit 120, and a control logic 130.

The memory cell array 110 includes a plurality of memory blocks BLK1 to BLKz connected to an address decoder 121 through row lines RL. The plurality of memory blocks BLK1 to BLKz are connected to a read/write circuit 123 through bit lines BL1 to BLm. Each of the plurality of memory blocks BLK1 to BLKz includes a plurality of memory cells. In an embodiment, the plurality of memory cells may be nonvolatile memory cells. Memory cells connected to the same word line (among the plurality of memory cells) may be defined as one physical page. The memory cell array 110 may be configured with one or a plurality of physical pages. In accordance with an embodiment, each of the plurality of memory blocks BLK1 to BLKz in the memory cell array 110 may include a plurality of dummy cells. One or more dummy cells may be connected in series between a drain select transistor and memory cells and between a source select transistor and the memory cells. Each of the memory cells of the memory device may be configured, for example, as a Single Level Cell (SLC) storing one data bit, a Multi-Level Cell (MLC) storing two data bits, a Triple Level Cell (TLC) storing three data bits, or a Quad Level Cell (QLC) storing four data bits.

The peripheral circuit 120 drives the memory cell array 110. For example, the peripheral circuit 120 may drive the memory cell array 110 to perform a program operation, a read operation, and an erase operation.

The peripheral circuit 120 may include the address decoder 121, a voltage generator 122, the read/write circuit 123, a data input/output circuit 124, and a sensing circuit 125. The address decoder 121 is connected to the memory cell array 110 through the row lines RL. The row lines RL may include drain select lines, word lines, source select lines, and a common source line. In accordance with an embodiment, the word lines may include normal word lines and dummy word lines. In accordance with an embodiment, the row lines RL may further include a pipe select line.

The address decoder 121 may operate under control of the control logic 130. The address decoder 121 receives an address ADDR from the control logic 130. The address decoder 121 may decode a block address in the received address ADDR and select at least one memory block among the memory blocks BLK1 to BLKz according to the decoded block address. The address decoder 121 may decode a row address in the received address ADDR. The address decoder 121 may select at least one word line among word lines of a selected memory block according to the decoded row address. The address decoder 121 may apply an operating voltage Vop supplied from the voltage generator 122 to the selected word line.

In a program operation, the address decoder 121 may apply a program voltage to the selected word line and may apply a pass voltage (e.g., having a level lower than that of the program voltage) to unselected word lines. In a program verify operation, the address decoder 121 may apply a verify voltage to the selected word line and may apply a verify pass voltage (e.g., having a level higher than that of the verify voltage) to the unselected word lines.

In a read operation, the address decoder 121 may apply a read voltage to the selected word line and may apply a read pass voltage (e.g., having a level higher than that of the read voltage) to the unselected word lines.

In accordance with an embodiment, an erase operation of the memory device 100 is performed in units of memory blocks. In an erase operation, the address ADDR input to the memory device 100 includes a block address. The address decoder 121 may decode the block address and may select at least one memory block according to the decoded block address. In the erase operation, the address decoder 121 may apply a ground voltage to word lines connected to the selected memory block.

In accordance with an embodiment, the address decoder 121 may decode a column address in the address ADDR transmitted thereto. The decoded column address may be transmitted to the read/write circuit 123. In an example, the address decoder 121 may include components including, but not limited to, a row decoder, a column decoder, and an address buffer.

The voltage generator 122 may generate a plurality of operating voltages Vop based on an external power voltage supplied to the memory device 100. The voltage generator 122 operates under the control of the control logic 130. In an embodiment, the voltage generator 122 may generate an internal power voltage by regulating the external power voltage. The internal power voltage generated by the voltage generator 122 may be used as an operation voltage of the memory device 100.

In an embodiment, the voltage generator 122 may generate a plurality of operating voltages Vop based on the external power voltage or the internal power voltage. The voltage generator 122 may generate various voltages for use by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of operating voltages Vop having various voltage levels, the voltage generator 122 may include a plurality of pumping capacitors for receiving the internal power voltage. The plurality of operating voltages Vop may then be generated by selectively activating the plurality of pumping capacitors under the control of control logic 130. The plurality of generated operating voltages Vop may be supplied to the memory cell array 110 by the address decoder 121.

The read/write circuit 123 includes first to mth page buffers PB1 to PBm connected to the memory cell array 110 through respective first to mth bit lines BL1 to BLm. The first to mth page buffers PB1 to PBm operate under the control of control logic 130.

The first to mth page buffers PB1 to PBm communicate data DATA with the data input/output circuit 124. In a program operation, the first to mth page buffers PB1 to PBm receive data DATA to be stored through the data input/output circuit 124 and data lines DL. In a program operation, the first to mth page buffers PB1 to PBm may transfer, to selected memory cells through the bit lines BL1 to BLm, data DATA received through the data input/output circuit 124 when a program pulse is applied to a selected word line. The memory cells of the selected memory cells may be programmed according to the transferred data DATA.

A memory cell connected to a bit line through which a program allow voltage (e.g., a reference (e.g., ground) voltage) is applied may have an increased threshold voltage. A threshold voltage of a memory cell connected to a bit line through which a program inhibit voltage (e.g., a power voltage) is applied may be maintained. In a program verify operation, the first to mth page buffers PB1 to PBm read data DATA stored in the selected memory cells (from the selected memory cells) through the bit lines BL1 to BLm.

In a read operation, the read/write circuit 123 may read data DATA from memory cells of a selected page through the bit lines BL, and may store the read data DATA in the first to mth page buffers PB1 to PBm.

In an erase operation, the read/write circuit 123 may float the bit lines BL. In an embodiment, the read/write circuit 123 may include a column select circuit.

The data input/output circuit 124 is connected to the first to mth page buffers PB1 to PBm through the data lines DL and may operate under the control of the control logic 130. The data input/output circuit 124 may include a plurality of input/output buffers that receive input data DATA. In a program operation, the data input/output circuit 124 may receive data DATA to be stored from an external controller. In a read operation, the data input/output circuit 124 outputs data, transmitted from the first to mth page buffers PB1 to PBm in the read/write circuit 123, to the external controller.

In a read operation or verify operation, the sensing circuit 125 may generate a reference current in response to an allow bit VRYBIT signal generated by the control logic 130. The sensing circuit 125 may then output a pass signal or fail signal to the control logic 130 by comparing a sensing voltage VPB received from the read/write circuit 123 and a reference voltage generated by the reference current.

The control logic 130 may be connected to the address decoder 121, the voltage generator 122, the read/write circuit 123, the data input/output circuit 124, and the sensing circuit 125. The control logic 130 may control overall operations of the memory device 100. The control logic 130 may operate in response to a command CMD transferred from an external device.

In one embodiment, the control logic 130 may control the peripheral circuit 120 by generating several signals in response to a command CMD and an address ADDR. For example, the control logic 130 may generate an operation signal OPSIG, a row address RADD, a read/write circuit control signal PBSIGNALS, and an allow bit VRYBIT in response to the command CMD and the address ADDR. The control logic 130 may output the operation signal OPSIG to the voltage generator 122, output the row address RADD to the address decoder 121, output the read/write circuit control signal PBSIGNALS to the read/write circuit 123, and output the allow bit VRYBIT to the sensing circuit 125. Also, the control logic 130 may determine whether the verify operation has passed or failed in response to the pass or fail signal PASS/FAIL output by the sensing circuit 125.

Figure 3:
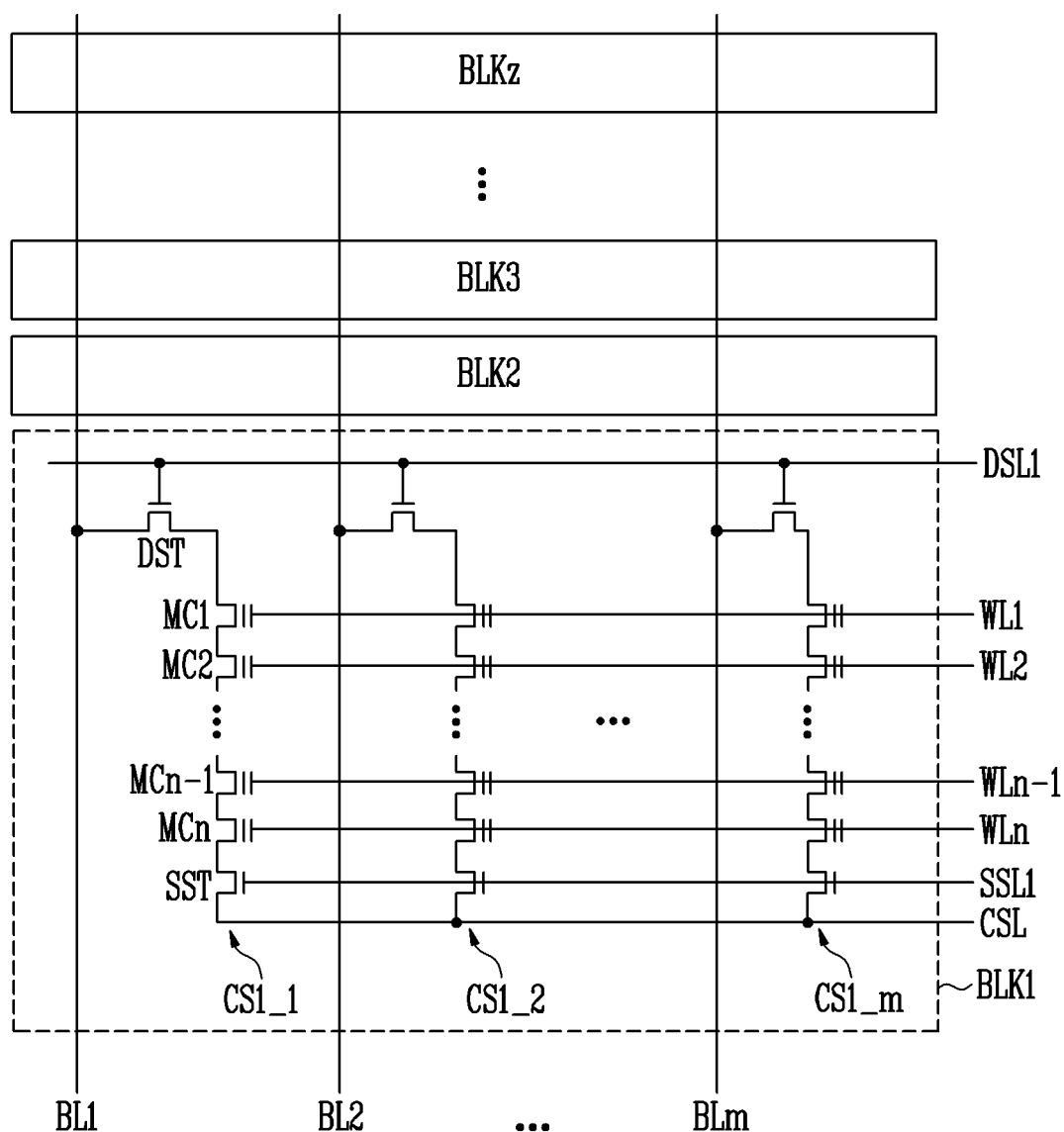
FIG. 3 illustrates an embodiment of a memory cell array.

FIG. 3 is a diagram illustrating an embodiment of the memory cell array shown in FIG. 2. Referring to FIG. 3, first to zth memory blocks BLK1 to BLKz are commonly connected to the first to mth bit lines BL1 to BLm. In FIG. 3, for convenience of description, components included in the first memory block BLK1 among the plurality of memory blocks BLK1 to BLKz are illustrated as being representative of the components included in the other memory blocks BLK2 to BLKz.

The memory block BLK1 may include a plurality of cell strings CS1_1 to CS1_$m$ (where m is a positive integer). First to mth cell strings CS1_1 to CS1_$m$ are respectively connected to the first to mth bit lines BL1 to BLm. Each of the first to mth cell strings CS1_1 to CS1_m includes a drain select transistor DST, a plurality of memory cells MC1 to MCn (n is a positive integer) connected in series, and a source select transistor SST.

A gate terminal of the drain select transistor DST, included in each of the first to mth cell strings CS1_1 to CS1_m, is connected to a drain select line DSL1. Gate terminals of first to nth memory cells MC1 to MCn, included in each of the first to mth cell strings CS1_1 to CS1_m, are respectively connected to first to nth word lines WL1 to WLn. A gate terminal of the source select transistor SST, included in each of the first to mth cell strings CS1_1 to CS1_m, is connected to a source select line SSL1. For convenience of description, the structure of the first cell string CS1_1 will be described as being representative of the structure of the other cell strings CS1_2 to CS1_m.

A drain terminal of the drain select transistor DST, included in the first cell string CS1_1, is connected to the first bit line BL1. A source terminal of the drain select transistor DST, included in the first cell string CS1_1, is connected to a drain terminal of the first memory cell MC1 in the first cell string CS1_1. The first to nth memory cells MC1 to MCn are connected in series to each other. A drain terminal of the source select transistor SST, included in the first cell string CS1_1, is connected to a source terminal of the nth memory cell MCn in the first cell string CS1_1. A source terminal of the source select transistor SST, included in the first cell string CS1_1, is connected to a common source line CSL. In an embodiment, the common source line CSL may be commonly connected to the first to zth memory blocks BLK1 to BLKz.

The drain select line DSL1, the first to nth word lines WL1 to WLn, and the source select line SSL1 are included in the row lines RL shown in FIG. 2. The drain select line DSL1, the first to nth word lines WL1 to WLn, and the source select line SSL1 is controlled by the address decoder 121 shown in FIG. 2. The common source line CSL may be controlled by the control logic 130 shown in FIG. 2. The first to mth bit lines BL1 to BLm are controlled by the read/write circuit 123 shown in FIG. 2.

Figure 4:
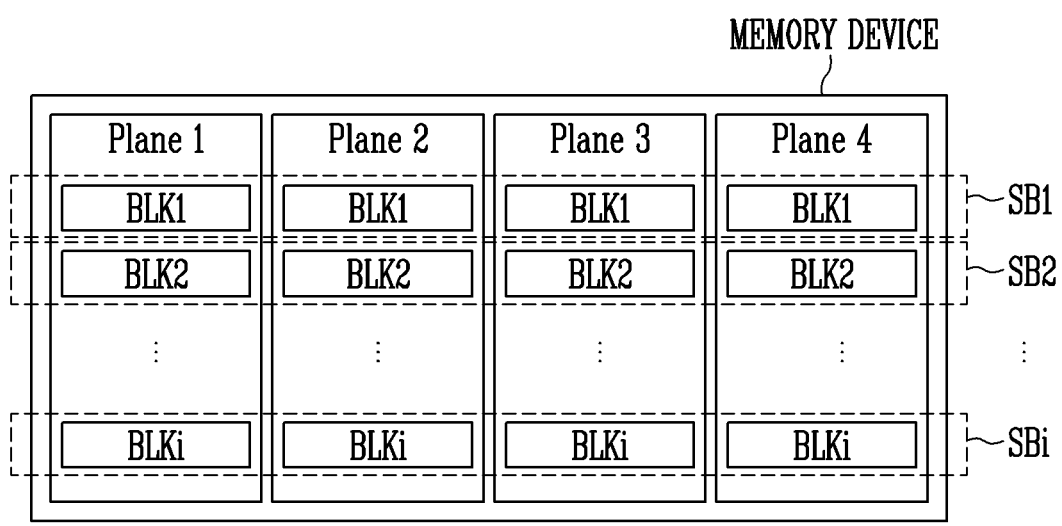
FIG. 4 illustrates an embodiment of a super block.

FIG. 4 is a diagram illustrating an embodiment of a super block. Referring to FIG. 4, one memory device may include a plurality of planes Plane 1 to Plane 4, each of which may include one or more memory blocks BLK1 to BLKi (where i is a positive integer). The number of the memory blocks included in each of the planes may vary among embodiments, e.g., the planes may include the same number of memory blocks or two or more of the planes may have different numbers of memory blocks.

A plane may be a unit for independently performing a program operation, a read operation, or an erase operation. Therefore, the memory device may include the address decoder 121 and the read/write circuit 123, which are described with reference to FIG. 2, for each plane.

In an embodiment, a super block may include at least two memory blocks in different planes, among memory blocks included in a plurality of planes. For example, first memory blocks BLK1 in the plurality of planes Plane 1 to Plane 4 may be allocated to a first super block SB1. Second memory blocks BLK2 in the plurality of planes Plane 1 to Plane 4 may be allocated to a second super block SB2, and so on. In this manner, ith memory blocks BLKi in the plurality of planes Plane 1 to Plane 4 may be allocated to an ith super block SBi. Therefore, the plurality of planes Plane 1 to Plane 4 in the one memory device may include first to ith super blocks SB1 to SBi.

When a memory operation is to be performed on memory blocks allocated to a super block, the memory device may perform the memory operation for each plane in parallel. This may be described, for example, as a multi-plane operation. The memory operation may be a read operation, a program operation, or an erase operation.

Figure 5:
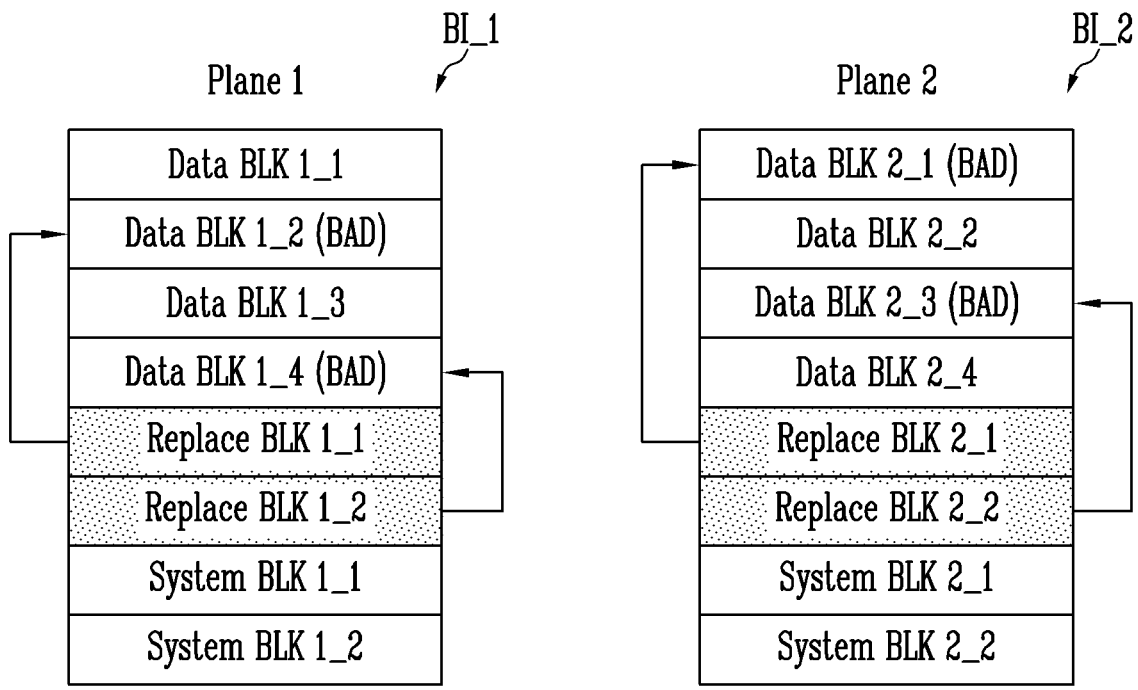
FIG. 5 illustrates an embodiment for performing bad block replacement.

FIG. 5 is a diagram illustrating an embodiment of a bad block replacement performed for a memory device. Referring to FIG. 5, the memory device may include a first plane Plane 1 and a second plane Plane 2. The number of the planes in the memory device may vary among different embodiments.

The first plane Plane 1 may include data blocks Data BLK 1_1 to Data BLK 1_4, replacement blocks Replace BLK 1_1 and Replace BLK 1_2, and system blocks System BLK 1_1 and System BLK 1_2. The second plane Plane 2 may include data blocks Data BLK 2_1 to Data BLK 2_4, replacement blocks Replace BLK 2_1 and Replace BLK 2_2, and system blocks System BLK 2_1 and System BLK 2_2. The numbers of the data blocks, the replacement blocks, and the system blocks in each plane may vary among different embodiments.

In FIG. 5, in block management information BI_1 on the first plane Plane 1, the data blocks Data BLK 1_2 and Data BLK 1_4 may be bad blocks. Bad data block Data BLK 1_2 may be replaced with the replacement block Replace BLK 1_1. Bad data block Data BLK 1_4 may be replaced with the replacement block Replace BLK 1_2.

In block management information BI_2 on the second plane Plane 2, the data blocks Data BLK 2_1 and Data BLK 2_3 may be bad blocks. Bad data block Data BLK 2_1 may be replaced with the replacement block Replace BLK 2_1. Bad data block Data BLK 2_3 may be replaced with the replacement block Replace BLK 2_2.

In super block allocation information SBI, the data blocks Data BLK 1_1 and Data BLK 2_1 may be allocated to a first super block SB1. The data blocks Data BLK 1_2 and Data BLK 2_2 may be allocated to a second super block SB2. The data blocks Data BLK 1_3 and Data BLK 2_3 may be allocated to a third super block SB3. The data blocks Data BLK 1_4 and Data BLK 2_4 may be allocated to a fourth super block SB4.

After the bad blocks are replaced, the data blocks Data BLK 1_2, Data BLK 1_4, Data BLK 2_1, and Data BLK 2_3 may be replaced with corresponding replacement blocks Replace BLK 1_1, Replace BLK 1_2, Replace BLK 2_1, and Replace BLK 2_2 in the super block allocation information SBI.

Even after the bad blocks are replaced, memory blocks of different planes are allocated to a super block, and therefore a multi-plane operation may be performed.

Figure 6:
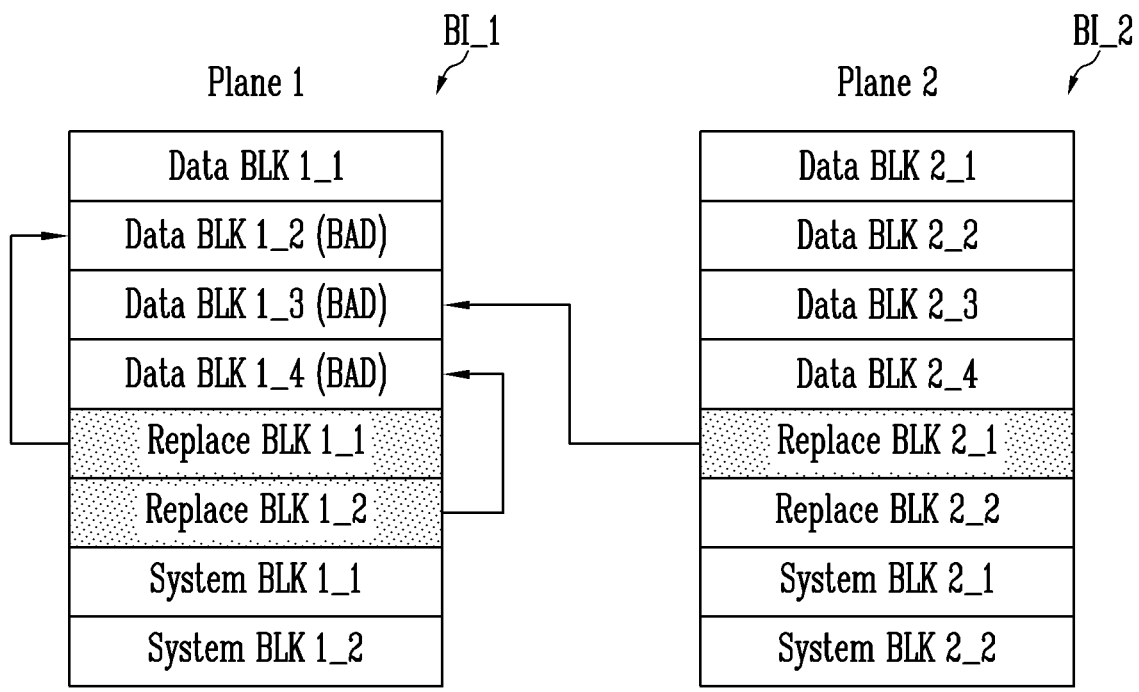
FIG. 6 illustrates an embodiment for performing bad block replacement.

FIG. 6 is a diagram illustrating an embodiment of bad block replacement in a memory device. Referring to FIG. 6, when a new bad block occurs in one plane after replacement blocks in the same plane are all used to replace bad blocks of the same plane, the new bad block may be replaced with a replacement block of another plane.

In FIG. 6, in the block management information BI_1 on the first plane Plane 1, the data blocks Data BLK 1_2, Data BLK 1_3, and Data BLK 1_4 may be bad blocks. Bad data block Data BLK 1_2 may be replaced with the replacement block Replace BLK 1_1. Bad data block Data BLK 1_4 may be replaced with the replacement block Replace BLK 1_2. Bad data block Data BLK 1_3 may be replaced with the replacement block Replace BLK 2_1 of the second plane Plane 2. After the bad blocks are replaced, the data block Data BLK 1_3 of the first plane Plane 1 may be replaced with the replacement block Replace BLK 2_1 of the second plane Plane 2 in the super block allocation information SBI.

Therefore, the memory blocks Replace BLK 2_1 and Data BLK 2_3 of the same second plane Plane 2, instead of different planes, are allocated to the third super block SB3. Hence, only a single plane operation is possible without performing a multi-plane operation. For example, when a bad block is replaced with a memory block of another plane (instead of a memory block of the same plane since replacement blocks of the same plane are all used), only memory blocks of the same plane are allocated to a super block. Therefore, a multi-plane operation may not be possible and only a single plane operation may be performed. The single plane operation (instead of the multi-plane operation) is performed, and therefore performance of the memory device may be decreased.

Figure 7:
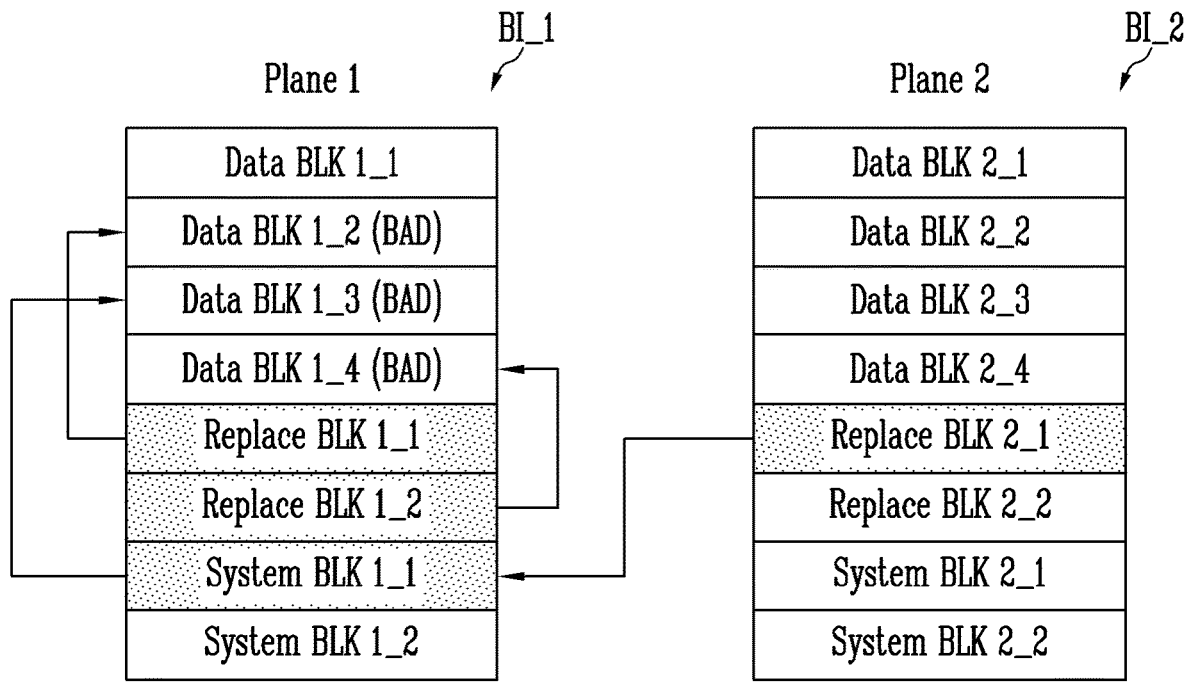
FIG. 7 illustrates an embodiment for performing bad block replacement.

FIG. 7 is a diagram illustrating an embodiment of a bad block replacement in a memory device. Referring to FIG. 7, when a new bad block occurs in one plane after replacement blocks included in the same plane are all used to replace bad blocks, the new bad block may be replaced with a system block of the same plane.

In FIG. 7, in the block management information BI_1 on the first plane Plane 1, the data blocks Data BLK 1_2, Data BLK 1_3, and Data BLK 1_4 may be bad blocks. Bad data block Data BLK 1_2 may be replaced with the replacement block Replace BLK 1_1. Bad data block Data BLK 1_4 may be replaced with the replacement block Replace BLK 1_2. Bad data block Data BLK 1_3 may be replaced with the system block System BLK 1_1 of the first plane Plane 1. Before the data block Data BLK 1_3 is replaced with the system block System BLK 1_1, data stored in the system block System BLK 1_1 may be moved to the replacement block Replace BLK 2_1 of the second plane Plane 2.

After the bad blocks are replaced, the data blocks Data BLK 1_2, Data BLK 1_3, and Data BLK 1_4 of the first plane Plane 1 may be replaced with the replacement blocks Replace BLK 1_1 and Replace BLK 1_2 and the system block System BLK 1_1 of the same first plane Plane 1 in the super block allocation information SBI.

In an embodiment, although a new bad block occurs in one plane after replacement blocks in the same plane are all used to replace bad blocks of the same plane, the corresponding bad block may be replaced with a system block of the same plane. For example, although the number of bad blocks in one plane exceeds that of replacement blocks in the same plane, the excessive number of bad blocks are replaced with system blocks of the same plane. Thus, memory blocks of different planes can be allocated to a super block, and a multi-plane operation can be performed.

Accordingly, although the number of bad blocks in one plane exceeds the number of replacement blocks in the same plane, a multi-plane operation can be performed and thus performance of the memory device can be maintained.

Figure 8:
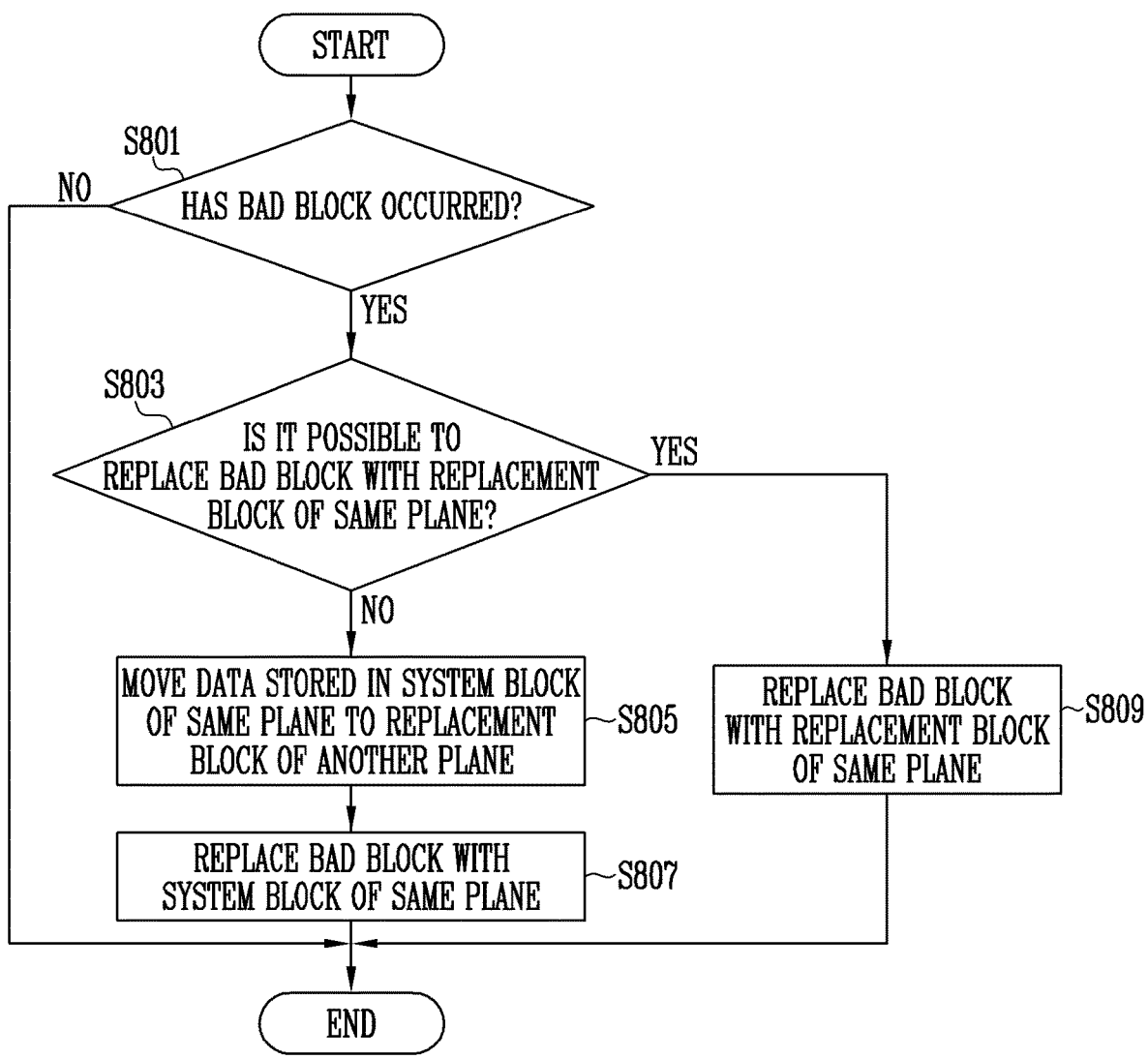
FIG. 8 illustrates an embodiment of operation of a storage device.

FIG. 8 is a flowchart illustrating an embodiment of an operation of a storage device. Referring to FIG. 8, in operation S801, the storage device may monitor whether a bad block has occurred among data blocks in a plane. When a bad block occurs as a monitoring result, the storage device proceeds to operation S803. When a bad block does not occur, the storage device ends the operation.

In operation S803, the storage device may determine whether it is possible to replace the bad block with a replacement block of the same plane in which the bad block has occurred. For example, the storage device may determine whether the number of bad blocks exceeds the number of replacement blocks of the same plane.

When it is possible to replace the bad block with the replacement block of the same plane as a determination result (e.g., when the number of bad blocks is equal to or less than the number of replacement blocks), the storage device proceeds to operation S809. When it is impossible to replace the bad block with the replacement block of the same plane (e.g., when the number of bad blocks exceeds that of replacement blocks), the storage device proceeds to operation S805.

In operation S805, the storage device may move data stored in a system block of the same plane to a replacement block of another plane. The amount of system information stored in the system block may be less than or equal to that of data stored in one memory block.

In operation S807, the storage device may replace the bad block detected in operation S801 with the system block of the same plane.

In operation S809, the storage device may replace the bad block with the replacement block of the same plane.

Figure 9:
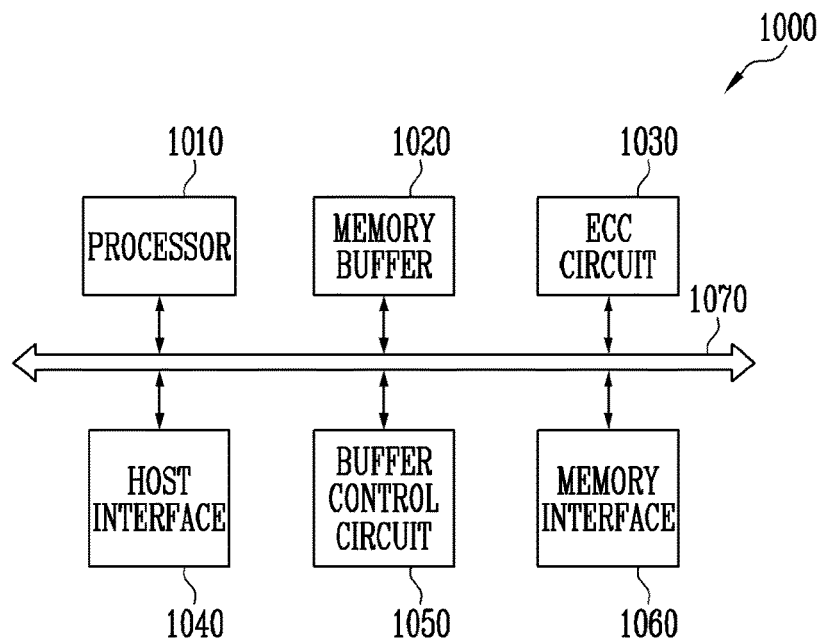
FIG. 9 illustrates an embodiment of a memory controller.

FIG. 9 is a diagram illustrating an of a memory controller 1000, which, for example, may correspond to the memory controller shown in FIG. 1.

Referring to FIG. 9, a memory controller 1000 is connected to a host and a memory device, and may access the memory device in response to a request from the host. For example, the memory controller 1000 may control various types of operations, including but not limited to write, read, erase, and background operations, of the memory device. The memory controller 1000 may serve as an interface between the memory device and the host. The memory controller 1000 may drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070. The bus 1070 may be configured to provide channels between components of the memory controller 1000.

The processor 1010 may control overall operations of the memory controller 1000 and may perform a logical operation. The processor 1010 may communicate with the external host through the host interface 1040 and may communicate with the memory device through the memory interface 1060. Also, the processor 1010 may communicate with the memory buffer 1020 through the buffer control circuit 1050. The processor 1010 may control operation of the storage device, for example, by using the memory buffer 1020 as a working memory, a cache memory or a buffer memory.

The processor 1010 may perform a function of a flash translation layer (FTL). The processor 1010 may translate a logical block address (LBA) provided by the host into a physical block address (PBA) through the FTL. The FTL may receive an LBA, using a mapping table, to translate the LBA into a PBA. Several address mapping methods of the FTL exist according to mapping units. Examples of representative address mapping methods include a page mapping method, a block mapping method, and a hybrid mapping method.

The processor 1010 may randomize data received from the host, for example, using a randomizing seed. The randomized data may be provided as data that is to be stored in the memory device to be programmed in the memory cell array.

In a read operation, the processor 1010 may derandomize data received from the memory device, for example, using a derandomizing seed. The derandomized data may be output to the host. In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands to be executed by the processor 1010. The memory buffer 1020 may include a Static RAM (SRAM) or a Dynamic RAM (DRAM).

The ECC circuit 1030 may perform an ECC operation, e.g., the ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host using at least one form of communication. Examples include a Universal Serial Bus (USB), a Serial AT Attachment (SATA), a High Speed InterChip (HSIC), a Small Computer System Interface (SCSI), Firewire, a Peripheral Component Interconnection (PCI), a PCI express (PCIe), a NonVolatile Memory Express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. For example, the memory interface 1060 may communicate a command, an address, and data with the memory device through one or more channels.

In an example, the memory controller 1000 may not include the memory buffer 1020 and the buffer control circuit 1050.

In an example, the processor 1010 may control operation of the memory controller 1000 using one or more codes. The processor 1010 may load one or more codes from a nonvolatile memory device (e.g., a read only memory (ROM)) in the memory controller 1000. In another example, the processor 1010 may load codes from the memory device through the memory interface 1060.

In an example, the bus 1070 of the memory controller 1000 may be partitioned into a control bus and a data bus. The data bus may be configured to transmit data in the memory controller 1000. The control bus may be configured to transmit control information such as a command and an address in the memory controller 1000. The data bus and the control bus are separated from each other and may not interfere or influence each other. The data bus may be connected to the host interface 1040, the buffer control circuit 1050, the ECC circuit 1030, and the memory interface 1060. The control bus may be connected to the host interface 1040, the processor 1010, the buffer control circuit 1050, the memory buffer 1020, and the memory interface 1060.

In an embodiment, the block manager 210 and the operation controller 220, for example, as shown in FIG. 1, may be included in the processor 1010. The block information storage 230 shown in FIG. 1 may be included in the memory buffer 1020.

Figure 10:
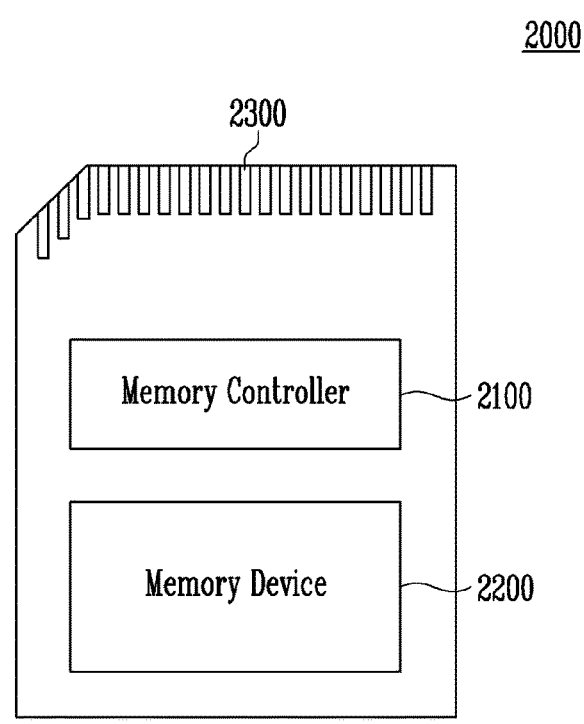
FIG. 10 illustrates an embodiment of a card system to which a storage device may be applied.

FIG. 10 is a block diagram illustrating an embodiment of a card system 2000 to which a storage device as described herein may be applied.

Referring to FIG. 10, the memory card system 2000 includes a memory controller 2100, a memory device 2200, and a connector 2300. The memory controller 2100 is connected to the memory device 2200 and is configured to access the memory device 2200. For example, the memory controller 2100 is configured to control read, write, erase, and background operations of the memory device 2200. The memory controller 2100 is configured to serve as an interface between the memory device 2200 and a host. The memory controller 2100 is configured to drive firmware for controlling the memory device 2200. In one embodiment, the memory controller 2100 may be implemented as the memory controller 200 described with reference to FIG. 1.

The memory controller 2100 may include components including, for example, a Random Access Memory (RAM), a processing unit, a host interface, a memory interface, and the error corrector.

The memory controller 2100 may communicate with an external device (e.g., the host) through the connector 2300 according to one or more communication protocols. Examples of the communication protocols include a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

The memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

In one embodiment, the memory controller 2100 and the memory device 2200 may be integrated into a single semiconductor device, in order to constitute a memory card. Examples of the memory card include a PC card (Personal Computer Memory Card International Association (PCM-CIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 11:
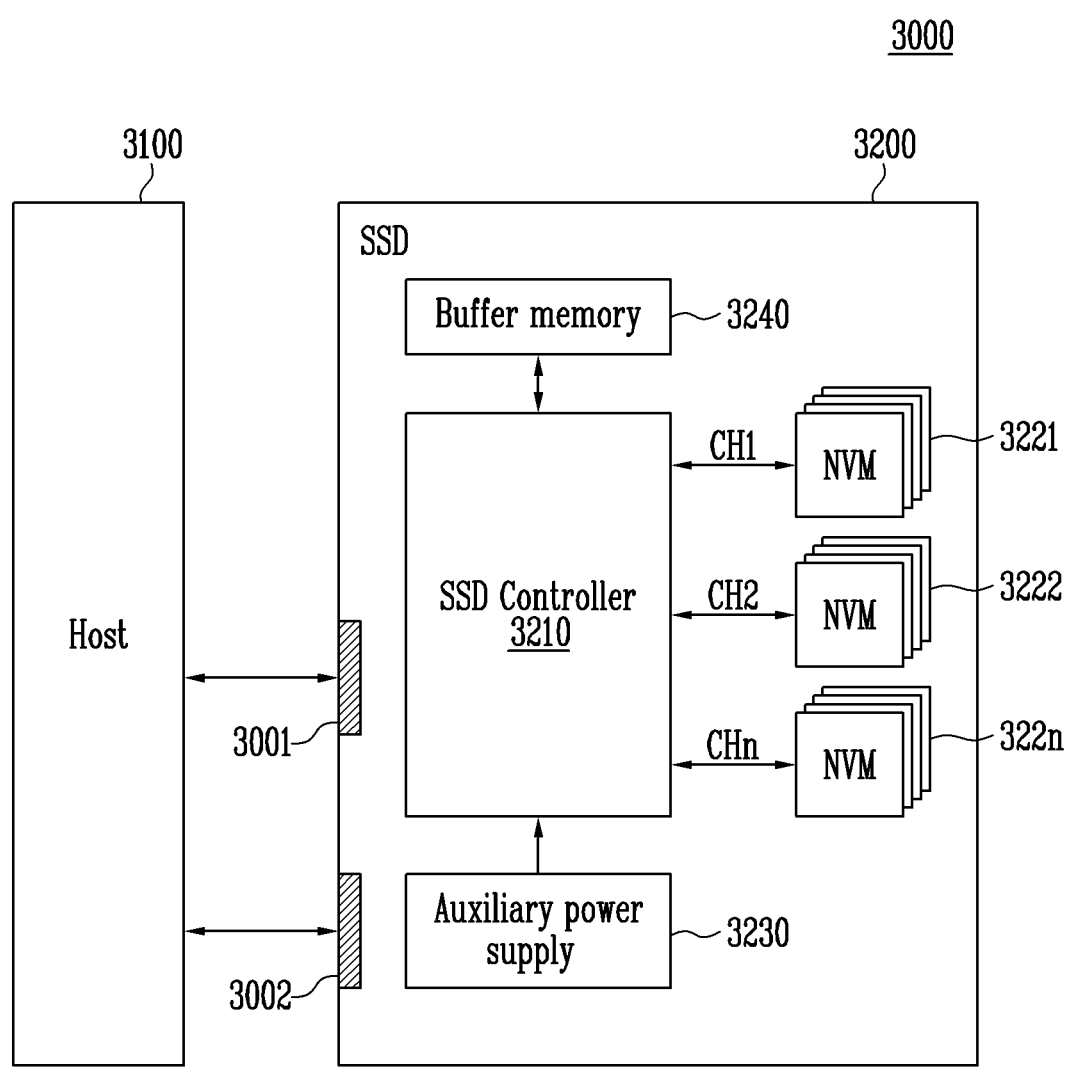
FIG. 11 illustrates an embodiment of a Solid State Drive (SDD) to which a storage device may be applied.

FIG. 11 is a block diagram illustrating an embodiment of a Solid State Drive (SDD) system 3000 to which a storage device as described herein may be applied. Referring to FIG. 11, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power supply 3230, and a buffer memory 3240.

In accordance with an embodiment, the SSD controller 3210 may serve as the memory controller 200 described with reference to FIG. 1. The SSD controller 3210 may control the plurality of flash memories 3221 to 322n in response to a signal SIG received from the host 3100. In one embodiment, the signal SIG may be a signal based on an interface between the host 3100 and the SSD 3200. For example, the signal SIG may be defined by at least one of the following types of interfaces: a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. When the supply of power from the host 3100 deviates from a predetermined waveform or pattern (e.g., is not smooth), the auxiliary power supply 3230 may provide power of the SSD 3200. The auxiliary power supply 3230 may be located, for example, in the SSD 3200 or external to the SSD 3200. For example, the auxiliary power supply 3230 may be located on a main board for providing auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, and/or may temporarily store meta data (e.g., a mapping table) of the flash memories 3221 to 322n. The buffer memory 3240 may include one or more volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 12:
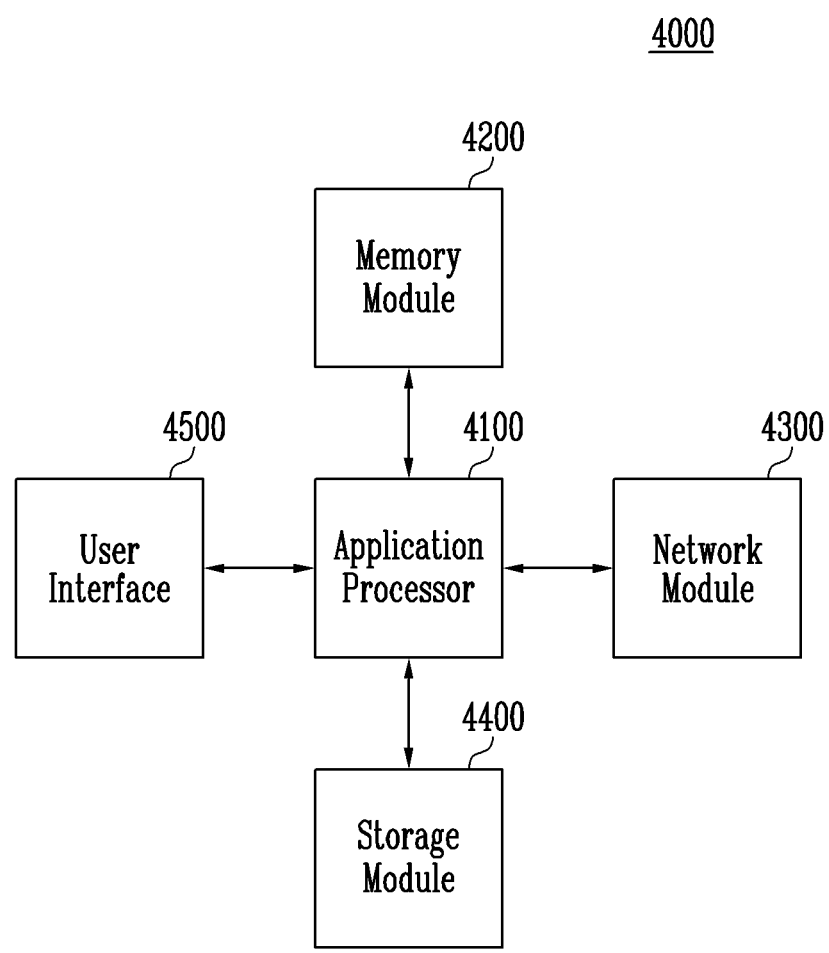
FIG. 12 illustrates an embodiment of a user system to which a storage device may be applied.

FIG. 12 is a block diagram illustrating an embodiment of a user system 4000 to which a storage device as described herein may be applied.

Referring to FIG. 12, the user system 4000 includes an application processor 4100, a memory module 4200, a network module 4300, a storage module 4400, and a user interface 4500. The application processor 4100 may drive components in the user system 4000, an operating system (OS), a user program, or the like. The application processor 4100 may include, for example, one or more controllers for controlling components in the user system 4000, various interfaces, a graphic engine, and the like. In one embodiment, the application processor 4100 may be implemented as a System-on-Chip (SoC).

The memory module 4200 may operate as a main memory, working memory, buffer memory or cache memory of the user system 4000. The memory module 4200 may include one or more volatile random access memories, examples of which include a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. The application processor 4100 and the memory module 4200 may be implemented, for example, as one semiconductor package, e.g., a Package on Package (PoP).

The network module 4300 may communicate with one or more external devices, and may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. The network module 4300 may be included, for example, in the application processor 4100.

The storage module 4400 may store data, for example, received from the application processor 4100. In one embodiment, the storage module 4400 may transmit data stored therein to the application processor 4100. The storage module 4400 may be implemented with a nonvolatile semiconductor memory device, examples of which include: a Phase-change RAM (PRAM), a Magnetic RAM (MRAM), a Resistive RAM (RRAM), a NAND flash, a NOR flash, or a NAND flash having a three-dimensional structure. Exemplarily, the storage module 4400 may be provided as a removable drive such as a memory card of the user system 4000 or an external drive.

The storage module 4400 may include one or more nonvolatile memory devices, for example, which operate in a manner similar or identical to the memory device 100 described with reference to FIG. 1. In one embodiment, storage module 4400 may operate in a manner similar or identical to the storage device 50 described with reference to FIG. 1.

The user interface 4500 may include one or more interfaces for inputting data or commands to the application processor 4100 or for outputting data to an external device. Examples of the one or more interfaces for inputting data include a keyboard, a keypad, a button, a touch panel, a touch screen, a touch pad, a touch ball, a camera, a microphone, a gyroscope sensor, a vibration sensor and a piezoelectric element. Examples of the one or more interfaces for outputting data include a Liquid Crystal Display (LCD), an Organic Light Emitting Diode (OLED) display device, an Active Matrix OLED (AMOLED) display device, an LED, a speaker, and a monitor.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure. One or more embodiments may be combined to form additional embodiments.

Meanwhile, various embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A storage device comprising:
a memory device including a first plane and a second plane, each including data blocks configured to store user data, one or more replacement blocks configured to replace one or more bad blocks, and system blocks configured to store system information; and
a memory controller configured to replace, when a bad block is detected in the first plane after all the one or more replacement blocks in the first plane are used to replace previously detected bad blocks, the detected bad block with a target system block selected among the system blocks in the first plane.

2. The storage device of claim 1, wherein the memory controller is configured to control the memory device to move data stored in the target system block to a replacement block in the second plane.

3. The storage device of claim 1, wherein the memory controller selects, as the target system block, one of the system blocks in the first plane storing an amount of system information that is less than or equal to a storage capacity of one system block in the first plane.

4. The storage device of claim 1, wherein the memory controller is configured to replace an address of the detected bad block with an address of the target system block.

5. The storage device of claim 1, wherein the memory controller is configured to allocate, to a super block, at least one of the data blocks included in the first plane and at least one of the data blocks included in the second plane.

6. The storage device of claim 5, wherein, when the detected bad block is included in the super block, the memory controller is configured to exclude the detected bad block from the allocation to the super block, and allocates the target system block to the super block.

7. The storage device of claim 5, wherein, when performing a memory operation on the super block, the memory controller is configured to control the memory device to perform a multi-plane operation of simultaneously driving the first plane and the second plane.

8. The storage device of claim 7, wherein the memory operation is a read operation, a program operation, or an erase operation.

9. A method for operating a storage device including a first plane and a second plane, each including data blocks configured to store user data, one or more replacement blocks configured to replace one or more bad blocks, and system blocks configured to store system information, the method comprising:
detecting whether a bad block occurs in the first plane; and
replacing, when a bad block is detected in the first plane after all the one or more replacement blocks in the first plane are used to replace previously detected bad blocks, the detected bad block with a target system block selected among the system blocks in the first plane.

10. The method of claim 9, wherein the replacing of the detected bad block with the target system block includes:
moving data stored in the target system block to one of the one or more replacement blocks in the second plane; and
replacing an address of the detected bad block with an address of the target system block.

11. The method of claim 9, wherein one system block among the system blocks in the first plane storing an amount of system information that is less than or equal to a storage capacity of one system block in the first plane is selected as the target system block.

12. The method of claim 9, further comprising allocating, to a super block, at least one of the data blocks included in the first plane and at least one of the data blocks included in the second plane.

13. The method of claim 12, further comprising:
excluding, when the detected bad block is included in the super block, the detected bad block from the allocation to the super block; and
allocating the target system block to the super block.

14. The method of claim 13, further comprising updating an address of the detected bad block as an address of the target system block, based on kinds and addresses of blocks included in each of the first and second planes.

15. The method of claim 12, wherein, when performing a memory operation on the super block, a multi-plane operation of simultaneously driving the first plane and the second plane is performed.

16. A memory controller for controlling a memory device including a first plane and a second plane, each including data blocks configured to store user data, one or more replacement blocks configured to replace one or more bad blocks, and system blocks configured to store system information, the memory controller comprising:
a block manager configured to allocate, to a super block, at least one of the data blocks included in the first plane and at least one of the data blocks included in the second plane; and
an operation controller configured to control the memory device to perform a multi-plane operation of simultaneously driving the first plane and the second plane, when performing a memory operation on the super block,
wherein, when a bad block is detected in the first plane after all the one or more replacement blocks in the first plane are used to replace previously detected bad blocks, the block manager is configured to replace the detected bad block with a target system block selected among the system blocks in the first plane.

17. The memory controller of claim 16, further comprising a block information storage configured to store block management information on kinds and addresses of blocks included in each of the first and second planes and super block allocation information on blocks allocated to the super block.

18. The memory controller of claim 17, wherein the block manager is configured to update, in the super block allocation information, an address of the detected bad block as an address of the target system block.

19. The memory controller of claim 18, wherein the operation controller is configured to control the memory device to perform the multi-plane operation, based on the updated super block allocation information.

20. A method for operating a storage device including a first plane and a second plane, each including data blocks configured to store user data, one or more replacement blocks configured to replace one or more bad blocks, and system blocks configured to store system information, the method comprising:
detecting a bad block in the first plane;
moving, when no more replacement blocks are available to replace the bad block in the first plane, data stored in a target system block selected among the system blocks in the first plane to one of the one or more replacement blocks in the second plane; and replacing the bad block with the target system block that is included in the first plane.

\* \* \* \* \*